(12) United States Patent
Hayashi

(10) Patent No.: US 8,680,765 B2
(45) Date of Patent: Mar. 25, 2014

(54) DISPLAY DEVICE AND METHOD FOR MANUFACTURING THE SAME

(71) Applicant: Sony Corporation, Tokyo (JP)

(72) Inventor: Naoki Hayashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/665,615

(22) Filed: Oct. 31, 2012

(65) Prior Publication Data

US 2013/0056762 A1   Mar. 7, 2013

Related U.S. Application Data

(60) Continuation of application No. 12/860,098, filed on Aug. 20, 2010, now Pat. No. 8,319,412, which is a division of application No. 11/355,636, filed on Feb. 15, 2006, now Pat. No. 7,806,743.

(30) Foreign Application Priority Data

Feb. 24, 2005   (JP) ................................. 2005-048224

(51) Int. Cl.
  *H01J 1/62*   (2006.01)
(52) U.S. Cl.
  USPC ......................................................... 313/506
(58) Field of Classification Search
  USPC .................. 313/495–497, 498, 506, 509, 512
  See application file for complete search history.

(56) References Cited

U.S. PATENT DOCUMENTS

| | | |
|---|---|---|
| 6,791,660 B1 | 9/2004 | Hayashi et al. |
| 2002/0057565 A1 | 5/2002 | Seo |
| 2003/0015961 A1 | 1/2003 | Yamazaki |
| 2003/0062125 A1 | 4/2003 | Takamatsu et al. |
| 2003/0218422 A1 | 11/2003 | Park et al. |
| 2004/0152392 A1 | 8/2004 | Nakamura |
| 2004/0160175 A1 | 8/2004 | Yi |
| 2005/0062414 A1 | 3/2005 | Hsiao et al. |
| 2005/0110404 A1 | 5/2005 | Park et al. |
| 2005/0260337 A1 | 11/2005 | Ogura et al. |

FOREIGN PATENT DOCUMENTS

| | | |
|---|---|---|
| JP | 2000-231986 | 8/2000 |
| JP | 2003-197366 | 7/2003 |
| JP | 2004-207234 | 7/2004 |
| JP | 2004-231957 | 8/2004 |
| JP | 2004-354648 | 12/2004 |
| JP | 2005-032682 | 2/2005 |
| JP | 2005-209631 | 8/2005 |
| WO | 03/106582 | 12/2003 |

*Primary Examiner* — Vip Patel
(74) *Attorney, Agent, or Firm* — Dentons US LLP

(57) ABSTRACT

A display device having a base substrate provided with light-emitting devices and terminal electrodes connected thereto; a sealing substrate disposed to face the base substrate; a first resin material between the base substrate and the sealing substrate so as to surround a first region in which the light-emitting devices are provided; and a second resin material between the base substrate and the sealing substrate and is filled in the first region surrounded by the first resin material so as to seal the light-emitting devices.

10 Claims, 5 Drawing Sheets

DISPLAY DEVICE AND METHOD FOR MANUFACTURING THE SAME

RELATED APPLICATION DATA

This application is a continuation of U.S. patent application Ser. No. 12/860,098, filed Aug. 20, 2010, which is a division of U.S. patent application Ser. No. 11/355,636, filed Feb. 15, 2006, issued on Oct. 5, 2010, as U.S. Pat. No. 7,806, 743, the entirety of which is incorporated herein by reference to the extent permitted by law. The present application claims the benefit of priority to Japanese Patent Application No. 2005-048224, filed in the Japanese Patent Office on Feb. 24, 2005, the entirety of which is incorporated by reference herein to the extent permitted by law.

BACKGROUND OF THE INVENTION

1. Field of the Invention

The present invention relates to display devices, and more particularly, relates to a display device including a substrate provided with light-emitting devices and a sealing substrate which is adhered to the substrate and to a method for manufacturing the display device.

2. Description of the Related Art

As a next-generation display device, a display device using organic electroluminescent devices has drawn attention. This display device has the following various features: the viewing angle is wide since self-luminous organic electroluminescent devices are used, energy saving may be obtained since a backlight is not necessary, the responsibility is high, the thickness of the device itself may be decreased, and the like. In addition, when this display device uses a plastic substrate as a substrate on which organic electroluminescent devices are provided, a flexible display device can be realized using inherent flexible properties of an organic material forming light-emitting devices.

Since having very inferior moisture resistance, the organic electroluminescent device of the display device described above is liable to be degraded by moisture present in the air, and as a result, problems may arise in that areas (dark spots) are generated which do not emit light, the brightness is decreased, and the like. Hence, a sealing technique has been necessary in most cases in order to prevent the entry of moisture into a display region in which the organic electroluminescent devices are provided.

Accordingly, for example, a complete solid sealing structure in which organic electroluminescent devices are sealed in a resin material has been proposed, the structure being formed by the steps of applying the resin material used as an adhesive onto a base substrate so as to cover the organic electroluminescent devices provided thereon, and then adhering a sealing substrate to the base substrate with the above resin material provide therebetween. In the structure described above, no spaces that may allow the entry of moisture are present between the above two substrates that enclose the organic electroluminescent devices, and as a result, the problems described above can be effectively prevented.

In addition, as a method for manufacturing a display device having the complete solid sealing structure described above, a method has been proposed which has the steps of applying an adhesive for display devices, which is formed using a photocurable composition, on one major surface of a sealing substrate, irradiating light to this adhesive for activation, and then adhering a base substrate to the sealing substrate with the adhesive provided therebetween while the light is being blocked. According to this method, while organic electroluminescent devices formed at the base substrate side are prevented from degradation which is caused by exposure to the light, the organic electroluminescent devices can be sealed in the adhesive (see Japanese Unexamined Patent Application Publication No. 2004-231957).

In manufacturing a display device having the complete solid sealing structure as described above, when an adhesive resin before curing flows and adheres onto terminals (terminal electrodes) for external connection extending from the organic electroluminescent devices, the connection between the display device and an external device with the terminal electrodes provided therebetween becomes unstable. Hence, in the manufacturing process described above, while the terminal electrodes are covered with a masking tape, the sequential steps described above have been carried out. As a result, the adhesion of the adhesive resin onto the terminal electrodes is prevented.

SUMMARY OF THE INVENTION

In manufacturing a display device, a plurality of display device portions may be formed in an array on a base substrate. In this case, in a step of adhering the base substrate to the sealing substrate, terminal electrodes and a masking tape covering them are provided between the base substrate and the sealing substrate.

Hence, the distance between the sealing substrate and the base substrate depends on the thickness of the masking tape and is set to a value more than the thickness thereof. The masking tape has a relatively large thickness, such as approximately 20 to 40 μm, the distance between the sealing substrate and the base substrate is not decreased smaller than the above thickness, and as a result, a resin material (adhesive) is to be filled into the wide space between the two substrates. This situation prevents further decrease in thickness of display devices.

In addition, in a display device in which light is emitted from the sealing substrate side, since the length of the resin material through which the light passes is increased, for example, color shift may occur at a wide viewing angle.

Accordingly, it is desirable to have a method for manufacturing a thinner display device, the manufacturing method being capable of sealing organic electroluminescent devices in a resin material provided between a base substrate and a sealing substrate while preventing the spread of the resin material into the terminal electrodes region without a masking tape.

A method for manufacturing a display device, according to an embodiment of the present invention, is a method in which a base substrate provided with light-emitting devices and terminal electrodes connected thereto is adhered to a sealing substrate which is disposed to face the base substrate with a resin material provided between the above two substrates so as to seal the light-emitting devices in the resin material, and in this method, the following steps are sequentially performed.

In a first step, on at least one of the base substrate and the sealing substrate, a first resin material is formed. When being formed on the base substrate, the first resin material is provided to surround a region in which the light-emitting devices are provided. On the other hand, when being formed on the sealing substrate, the first resin material is provided to surround a region corresponding to the region at the base substrate side in which the light-emitting devices are provided.

In a second step, a second resin material is applied in the region surrounded by the first resin material. Subsequently, in a third step, polymerization of at least one of the first resin material and the second resin material is initiated. Next, in a subsequent fourth step, the base substrate and the sealing substrate are adhered to each other with the first resin material and the second resin material provided therebetween. Then, in a fifth step, the polymerization of the first resin material and that of the second resin material are promoted, so that curing is performed.

In the manufacturing method described above, since the second resin material is applied in the region surrounded by the first resin material, the second resin material is prevented from flowing into the region located outside the first resin material, and hence the application of the resin material is restricted in the region surrounded by the first resin material. Hence, the terminal electrodes disposed outside the region surrounded by the first resin material are prevented from being brought into contact with the resin material. Accordingly, it becomes not necessary to cover the terminal electrodes with a masking tape, and as a result, as compared to the case in which a masking tape is used, the distance between the base substrate and the sealing substrate can be decreased.

In addition, a display device according to an embodiment of the present invention is a display device manufactured by the above manufacturing method.

According to the embodiments of the present invention described above, since the light-emitting devices may be sealed in the resin material provided between the base substrate and the sealing substrate while the spread of the resin material into the terminal electrodes is prevented without a masking tape, the distance between the base substrate and the sealing substrate can be decreased, and hence the thickness of the display device can be further decreased.

DESCRIPTION OF THE PREFERRED EMBODIMENTS

Hereinafter, the embodiments of the present invention will be described with reference to accompanying drawings. In the following embodiments, with reference to a display device having a substrate and light-emitting devices formed in an array thereon, a method for manufacturing a display device and a display device manufactured by the above method are described in that order.

<First Embodiment>

FIGS. 1A to 1D are each a cross-sectional view of a display device in process for illustrating a manufacturing method according to this embodiment, and the display device is manufactured as described below.

Figure 1A:
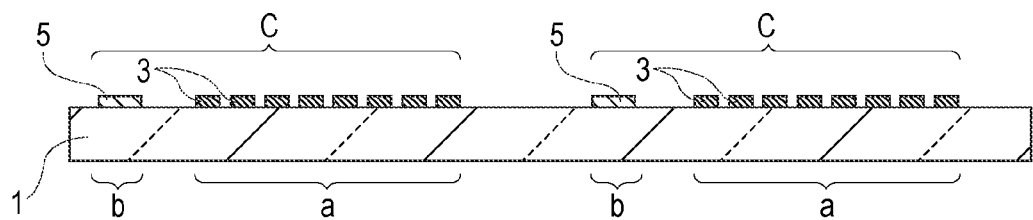
FIGS. 1A to 1D are each a cross-sectional view of a display device in process for illustrating a manufacturing method according to a first embodiment of the present invention.

First, as shown in FIG. 1A, a base substrate 1 is prepared. This base substrate 1 may be formed of a glass material such as a non-alkaline glass and may also be formed, for example, of a plastic material or a film material partly including polycarbonate, polyester, poly(ether sulfone), polyimide, or the like. In addition, on one major surface of the base substrate 1, a plurality of device portions C is provided. In a display region a which is located at the center of each device portion C on the base substrate 1, organic electroluminescent devices 3 are arranged in a matrix, which are connected to respective drive circuits not shown in the figure. In addition, terminal electrodes 5 connected to the respective organic electroluminescent devices 3 are formed in a peripheral region b located outside the display region a. In the case described above, for example, the structure is formed such that the organic electroluminescent devices 3 are elements emitting red light, elements emitting green color, and elements emitting blue color, which are arranged in a predetermined state.

In this embodiment, light generated from the organic electroluminescent device 3 is emitted at the side opposite to the base substrate 1, and for example, the structure is as follows. That is, on the base substrate 1, a first electrode having a reflection function, an organic layer containing a light-emitting layer, and a second electrode made of a semitransparent material are laminated in that order.

Among the above layers, the first electrode having a reflection function is used, for example, as an anode and is formed of a metal such as platinum (Pt), gold (Au), silver (Ag), chromium (Cr), or tungsten (W) or an alloy thereof.

In addition, the organic layer containing a light-emitting layer has a thickness which is specifically determined by light color generated from the organic electroluminescent device and is formed of a hole transport layer, the light-emitting layer, and an electron transport layer laminated in that order from the first electrode side. The hole transport layer is a layer increasing a hole injection efficiency for the light-emitting layer. The light-emitting layer is a layer generating light by recombination of electrons and holes that occurs when an electric field is applied. The electron transport layer is a layer increasing an electron injection efficiency for the light-emitting layer. As a material forming the hole transport layer, for example, bis[(N-naphthyl)-N-phenyl]benzidine (α-NPD) may be mentioned. In addition, depending on light colors generated from the light-emitting layers, materials therefor are different from each other, and for example, for a red organic electroluminescent device, a mixture of an 8-quinolinol aluminum complex ($Alq_3$) and 4-dicyanomethylene-6-(p-dimethylaminostyryl)-2-methyl-4H-pyran (DCM) in a volume ratio of 1 to 2 may be used. For a green organic electroluminescent device, for example, an 8-quinolinol aluminum complex ($Alq_3$) may be used. For a blue organic electroluminescent device, for example, bathocuproin (BCP) may be used. In addition, as a material forming the electron transport layer, for example, 8-quinolinol aluminum complex ($Alq_3$) may be mentioned.

In addition, the second electrode made of a semitransparent material is a semitransparent electrode having semi-transparency to light generated from the light-emitting layer and is used as a cathode. This second electrode is formed, for example, of an alloy of magnesium and silver. The semitransparent electrode is an electrode reflecting light generated from the light-emitting layer between the anode and the cathode. That is, by using the semitransparent electrode, light generated from the light-emitting layer is allowed to resonate by the semitransparent electrode and the anode, so that the multiple beam interference of light generated from the light-emitting layer occurs. Accordingly, the half-band width of a spectrum of emission light is decreased, and as a result, the color purity can be improved. In addition, exterior light incident through a sealing substrate can also be attenuated by the multiple beam interference.

Accordingly, the organic electroluminescent device 3 is configured so that the light generated from the light-emitting layer is emitted from the cathode side which is opposite to the base substrate 1.

Figure 1B:
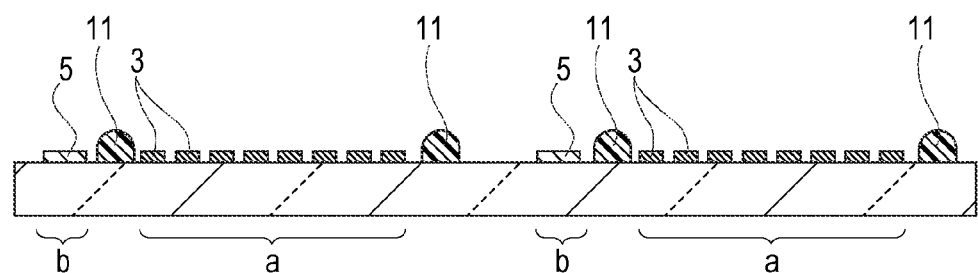

Next, as shown in FIG. 1B, a first resin material 11 is formed on the base substrate 1 at the side on which the organic electroluminescent devices 3 are provided so as to surround one of the display regions a in which the organic electroluminescent devices are provided and so as to dispose the peripheral region b in which the terminal electrodes 5 are provided outside the first resin material 11. In this case, the first resin material 11 is formed, for example, by application using a dispenser so as to surround the entire periphery of the display region a. In this step, the width of the first resin material 11 formed by application is set to 30 to 500 μm and preferably is set to 30 to 300 μm. In addition, the height of the first resin material 11 formed by application is set to approximately 10 to 50 μm and is preferably set to 10 to 30 μm.

The first resin material 11 is formed using a UV curable resin having slow curing properties (hereinafter referred to as "slow-curing resin"). The slow-curing resin is a resin that maintains its fluidity even after being irradiated with UV rays and is then fully cured after a predetermined time passes, and in order to further improve the adhesive strength, a heating step may be required after the UV irradiation in some cases.

The slow-curing resin is formed of (1) a photo-cationic polymerizable compound, (2) a photo-cationic polymerization initiator and (3) a cure control compound.

Among the compounds mentioned above, as the photo-cationic polymerizable compound (1), a compound containing at least one photo-cationic polymerizable functional group in one molecule may be used, and as the functional group, for example, an epoxy, oxetane, hydroxyl, vinyl ether, episulfide, or ethyleneimine group may be mentioned. Among these mentioned above, a compound having at least one epoxy group in one molecule is preferably used. As the compound having an epoxy group, for example, there may be mentioned a bisphenol type epoxy resin such as a bisphenol A type epoxy resin or a bisphenol F type epoxy resin, or an epoxy resin having two functionalities or more, such as a phenol novolac type epoxy resin, a cresol novolac type epoxy resin, a glycidyl ether type epoxy resin, or a glycidyl amine type epoxy resin. As a commercially available epoxy resin, for example, "Epicoat 828", "Epicoat 1001", or "Epicoat 1002" (which are all manufactured by Japan Epoxy Resin Co., Ltd.) may be mentioned.

In addition, as the photo-cationic polymerization initiator (2), either an ionic compound or a non-ionic compound may be used. As the ionic compound, for example, there may be mentioned onium salts, such as an aromatic diazonium salt, aromatic halonium salt, and aromatic sulfonium salt, and organic metal complexes such as an iron-allene complex, titanocene complex, and arylsilanol-aluminum complex. These photo-cationic polymerization initiators may be used alone or in combination. In addition, as a pairing anion of the above ionic compound, for example, an anion containing boron, phosphorus, arsenic or antimony may be used, and in particular, an anion containing boron or phosphorus is preferably used. As a commercially available material, for example, "Adeca optomer SP150", "Adeca optomer SP170" (both of which are manufactured by Asahi Denka Co., Ltd.), "UVE-1014" (manufactured by General Electric Co., Ltd), or "Photoinitiator 2074" (manufactured by Rhodia Inc.) may be mentioned. As the non-ionic compound, for example, nitrobenzyl esters, sulfonic acid derivatives, phosphates, phenol sulfonates, and diazonaphtoquinone may be mentioned. The photo-cationic polymerization initiator preferably has a molecular weight of 400 or more and absorbs light having a wavelength of 300 nm or more and more preferably absorbs light having a wavelength of 300 to 400 nm.

In addition, as the cure control compound (3), any material may be used as long as it has an ether bond, and for example, there may be mentioned a crown ether or a poly(alkylene oxide) such as polyethylene glycol, polypropylene glycol, or poly(oxytetramethylene)glycol. These cure control compounds mentioned above may be used alone or in combination. The terminal of the above poly(alkylene oxide) is not particularly limited, and it may be a hydroxyl group, may be etherified or esterified by another compound, or may be a functional group such as an epoxy group. Among those mentioned above, a hydroxyl group or an epoxy group is preferably used since being allowed to react with the photo-cationic polymerizable compound described above. In addition, as the above poly(alkylene oxide), a poly(alkylene oxide) adduct of a bisphenol A derivative is preferably used, and in particular, a compound having a hydroxyl group or an epoxy group as the terminal is also preferably used. The cure control compound preferably has at least two polyethylene glycol and/or polypropylene glycol units in one molecule. As a commercially available cure control compound having at least two polyethylene glycol units in one molecule, for example, "Rikaresin BEO-60E" and "Rikaresin EO-20" (both of which are manufactured by New Japan Chemical Co., Ltd.) may be mentioned. In addition, as a commercially available cure control compound having at least two polypropylene glycol units in one molecule, for example, "Rikaresin BPO-20E" and "Rikaresin PO-20" (both of which are manufactured by New Japan Chemical Co., Ltd.) may be mentioned. As the above crown ether, for example, 12-crown-4, 15-crown-5, 18-crown-6 may be mentioned by way of example.

In addition, in the slow-curing resin containing the compounds (1) to (3), relative to 100 parts by weight of the photo-cationic polymerizable compound (1), the amount of the photo-cationic polymerization initiator (2) is set to 0.1 to 10 parts by weight, and the amount of the cure control compound (3) is set to 0.3 to 20 parts by weight. Predetermined amounts of the compounds described above are mixed together at room temperature or by heating using a mixer such as a homodisper, homomixer, universal mixer, planetary mixer, kneader, three-roll mixer, or the like, so that a desired slow-curing resin can be prepared.

In addition, an inorganic filler may be contained in the above slow-curing resin in order to improve the moisture permeability. As the inorganic fillers, for example, there may be mentioned carbonates and hydrogen carbonates of alkaline metals or alkaline earth metals, such as calcium carbonate, calcium hydrogen carbonate, sodium carbonate and sodium hydrogen carbonate; inorganic powders such as colloidal silica, talc, clay, and titanium oxide: inorganic hollow materials such as glass balloons, alumina balloons, and ceramic balloons; and inorganic fibers such as glass fibers. These inorganic fillers may be used alone or in combination. In addition, organic spherical materials such as nylon beads and acrylic beads; organic hollow materials such as acrylic balloons; and monofilaments made of polyester, rayon, and nylon may also be contained.

Furthermore, a moisture absorber may also be contained in the slow-curing resin in order to prevent the entry of moisture. As the moisture absorbers, for example, alkaline earth metal oxides such as silica gel, molecular sieve, calcium oxide, barium oxide, and strontium oxide may be mentioned.

In addition, in the slow-curing resin, various additives such as an adhesion improver, reinforcing agent, softener, plasticizer, viscosity controller, and sensitizer may also be contained.

The first resin material 11 using the above slow-curing resin may contain spacers for controlling the height of the first resin material 11 obtained by application.

Figure 1C:
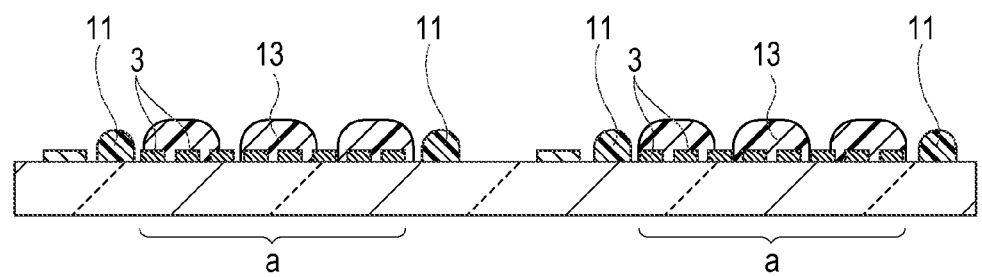

Next, as shown in FIG. 1C, a second resin material 13 is applied in the display region a surrounded by the first resin material 11.

In this step, by using a dispenser or the like, it is preferable that the second resin material 13 be applied to one point in the display region a surrounded by the first resin material 11, or it is preferable that depending on the shape of the display region a, the second resin material be applied to several points in the display region a or be applied to draw linear lines in combination with wavy lines therein so that air bubbles are not allowed to remain after a subsequent step in which the base substrate is adhered to the sealing substrate.

In addition, as the second resin material 13, for example, a UV curable resin or a thermosetting resin may be used having an adhesion function and having a transmission factor of 80% or more after the resin is cured. As the resin material having the adhesion function described above, for example, an epoxy resin or an acrylic resin may be used, and in particular, a material is preferably used having a tensile adhesion strength of 1 MPa or more or a tensile shear adhesion strength of 1 MPa or more after the material is cured. When chemical reaction with the first resin material 11 is taken into consideration, the second resin material 13 is preferably formed using a resin material that contains components similar to resin components of the first resin material 11. In addition, when a transmission factor of 80% or more can be maintained after the curing, various additives such as an inorganic filler, spacers, adhesion improver, reinforcing agent, softener, plasticizer, and viscosity controller may be used.

Figure 2A:
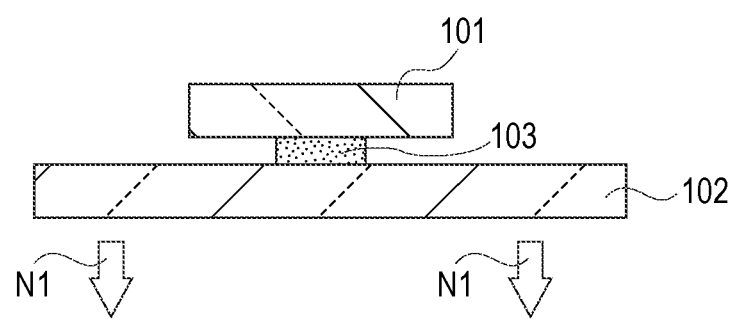
FIGS. 2A and 2B are views for illustrating a method for measuring an adhesive strength.

The measurement of the tensile adhesion strength is performed as shown in FIG. 2A in which two non-alkaline glass substrates for display purpose (trade name: AN 100 manufactured by Asahi Glass Co., Ltd.) 101 and 102 are used. In this measurement, the rectangular-shaped glass substrates 101 and 102 are disposed so as to intersect each other, and a resin 103 for measurement is provided between the above glass substrates. In this step, the resin 103 is provided for measurement so as to form a cylindrical shape having a diameter of 2 mm and a height of 200 μm, and the circular portions thereof are adhered to the glass substrates. The resin 103 provided between the two glass substrates 101 and 102 is fully cured by heating or by UV irradiation. Subsequently, while the glass substrate 101 is fixed, a strength (force) N1, which will not break the glass substrates 101 and 102, is applied at room temperature to the other glass substrate 102 in a direction perpendicular to the substrate surface thereof so as to separate the glass substrates 102 from the glass substrate 101. Subsequently, the strength N1 obtained at which the resin material is destroyed is regarded as the tensile adhesion strength.

Figure 2B:
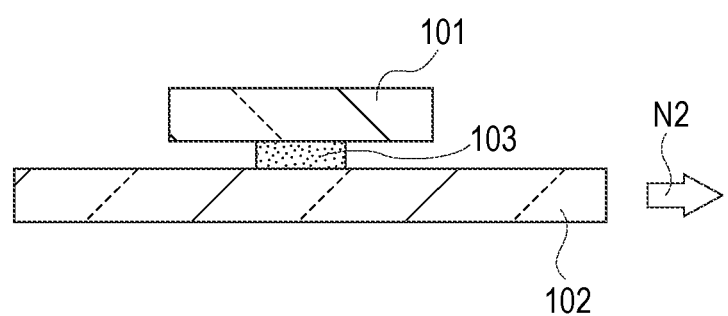

In addition, the measurement of the tensile shear adhesion strength is performed as shown in FIG. 2B. That is, after a resin for measurement provided between the two glass substrates 101 and 102 is fully cured in a manner similar to that described above, while the glass substrate 101 is being fixed, a strength (force) N2, which will not break the glass substrates 101 and 102, is applied at room temperature to the other glass substrate 102 in a direction parallel to the surface thereof. Subsequently, the strength N2 obtained at which the resin material is destroyed is regarded as the tensile shear adhesion strength.

Next, although not shown in the figure, in a region of an end portion of the base substrate 1 other than the display region a and the peripheral region b, that is, in a region which is to be discarded by cutting or the like at the final stage, a UV curable resin (temporary adhesive resin), which will be described below, is applied so as to temporarily adhere between the sealing substrate and the base substrate 1. In this step, for example, the temporary adhesive resin is applied to two points located on the diagonal line. As the temporary adhesive resin, a resin material similar to that for the first resin material 11 or the second resin material 13 may be used.

In addition, the formation of the first resin material 11, the second resin material 13, and the temporary adhesive resin is preferably performed in an inert gas atmosphere. However, when these formation steps are performed within a short period of time after the organic layer is formed for the organic electroluminescent devices, the formation may be performed in the air.

Figure 1D:
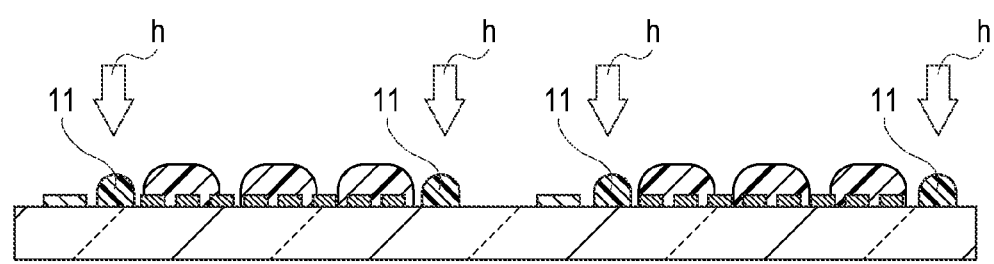

Subsequently, as shown in FIG. 1D, only the first resin material 11 is irradiated with UV rays h. By this irradiation, polymerization of the first resin material 11 formed of the UV curable resin having slow curing properties (slow-curing resin) is initiated. In this step, the amount of the UV rays h may not be an amount required for fully curing the resin forming the first resin material 11, and the total amount of the UV rays h and UV rays, which will be irradiated after the sealing substrate is adhered to the base substrate, may reach the above required amount.

In addition, it is also important to adjust the amount of the UV rays h so as not to fully cure the first resin material before a subsequent adhesion step is performed. The degree of cure of the slow-curing resin forming the first resin material 11 may be measured using a vibrating needle curemeter (for example, manufactured by RAPRA Technology Ltd). When this measurement device is used, the start of amplitude attenuation is regarded as a cure degree of 0%, and the end of the attenuation is regarded as a cure degree of 100%. In addition, right before the adhesion step, the degree of cure of the first resin material 11 is preferably maintained to 70% or less.

The irradiation of the UV rays h to the first resin material 11 described above may be performed before the application of the second resin material 13 which was described with reference to FIG. 1C.

Figure 3A:
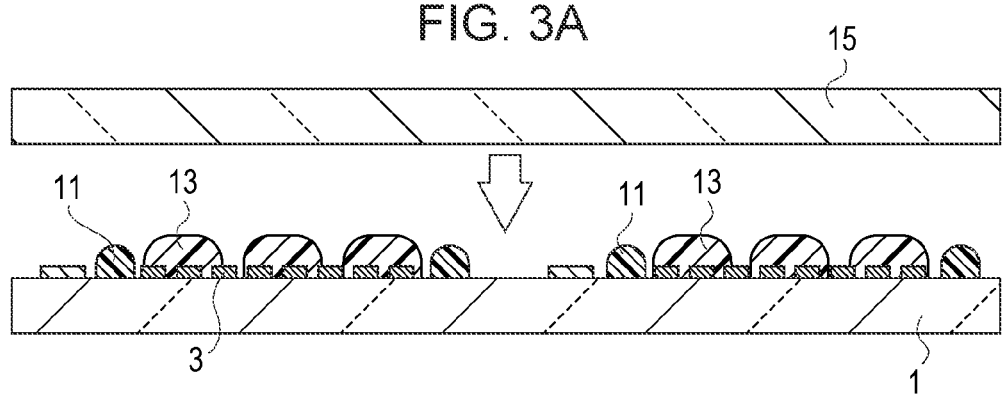
FIGS. 3A to 3D are cross-sectional views of a display device in process for illustrating a manufacturing method according to the first embodiment and other embodiments of the present invention.

Next, as shown in FIG. 3A, a sealing substrate 15 is prepared which is disposed to face the base substrate 1. This sealing substrate 15 may be formed of a glass material such as a non-alkaline glass and may also be formed of a plastic material or a film material partly including polycarbonate, polyester, poly(ether sulfone), polyimide, or the like. In addition, corresponding to the organic electroluminescent devices formed on the base substrate 1, color filters which are not shown in the figure, that is, red color filters, green color filters, and blue color filters are provided on the sealing substrate 15, and a black matrix is also provided thereon. Accordingly, light generated from the organic electroluminescent devices 3 is emitted through the color filters, and in addition, exterior light reflected at the organic electroluminescent devices and the like is absorbed, so that the contrast is improved. These color filters are disposed so as to face the respective organic electroluminescent devices 3.

Next, the surface of the base substrate 1 on which the first resin materials 11 and the second resin materials 13 are formed and the surface of the sealing substrate 15 (or opposite surface thereto) on which the color filters are formed are disposed to face each other. In this step, when the surface on which the color filters are formed is disposed to face the base substrate 1 side, the color filters can be protected since being not exposed to the exterior.

Figure 3B:
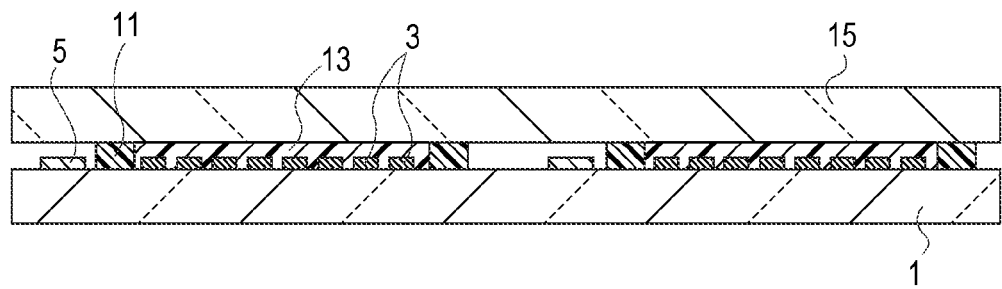

As shown in FIG. 3B, the base substrate 1 and the sealing substrate 15 are adhered to each other with the first resin material 11 and the second resin material 13 provided therebetween. By this step, the organic electroluminescent devices 3 are sealed in the second resin material 13. This adhesion step is performed in a reduced-pressure atmosphere of approximately 1 to 100 Pa before the first resin material 11 and the second resin material 13 are fully cured. By the step described above, the second resin material 13 is preferably filled between the base substrate 1 and the sealing substrate 15 so as not to form air bubbles. In addition, in this step, the temporary adhesive resin described above is provided between the base substrate 1 and the sealing substrate 15.

In addition, in the step described above, whenever necessary, the sealing substrate 15 is uniformly pressed onto the base substrate 1, so that the first resin material 11 and the second resin material 13, which are provided between the base substrate 1 and the sealing substrate 15, are uniformly formed to have a predetermined thickness. In the case described above, the thickness of the first resin material 11 and that of the second resin material 13 between the base substrate 1 and the sealing substrate 15 are set to 25 μm or less even at the thickest part and are preferably set to 20 μm or less. In addition, as long as concavo-convex portions such as electrodes formed on the base substrate 1 are not brought into contact with concavo-convex portions such as color filters formed on the sealing substrate 15, the thickness of the first resin material 11 and that of the second resin material 13 are preferably decreased as small as possible.

Furthermore, before the first resin material 11 and the second resin material 13 are cured, the base substrate 1 and the sealing substrate 15 are moved while being adhered to each other so that the organic electroluminescent devices 3 are positioned at predetermined places with respect to the color filters. In this step, the base substrate 1 is positioned at a predetermined place with respect to the sealing substrate 15 using alignment marks which are formed beforehand.

Subsequently, after this positioning, the temporary adhesive resin applied to the end portion of the base substrate 1 is irradiated with UV rays for curing, so that the substrate is not displaced from the predetermined place.

The above positioning and the irradiation of UV rays to the temporary adhesive resin may be performed either in the air or in an inert gas atmosphere.

Figure 3C:
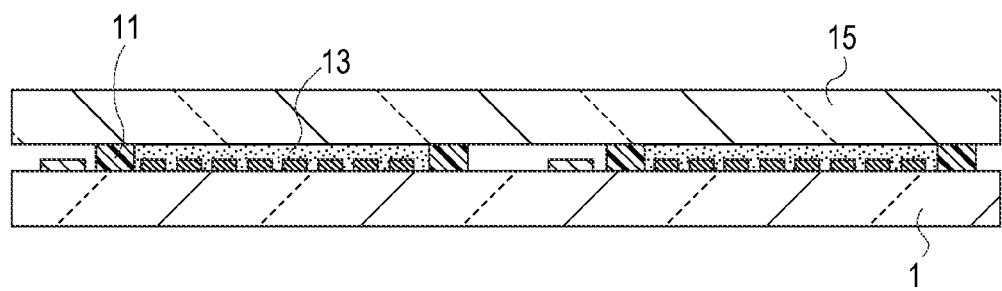

After the steps described above, as shown in FIG. 3C, polymerization of the first resin material 11 and that of the second resin material 13 are promoted so as to complete the curing. The step described above is performed in the air or in an inert gas atmosphere. In this step, for example, the first resin material 11 and the second resin material 13 are fully cured by irradiation thereof with UV rays, followed by heating at a constant temperature of 100° C. or less. Alternatively, depending on materials forming the first resin material 11 and the second resin material 13, curing may be performed only by irradiation of UV rays or only by heating.

In addition, in the step described above, when the first resin material 11 is irradiated with UV rays, irradiation may be performed so that the total amount of the UV rays in this step and the UV rays irradiated to the first resin material 11 in the step described with reference to FIG. 1D reaches an amount of UV rays required for fully curing the first resin material 11.

Figure 3D:
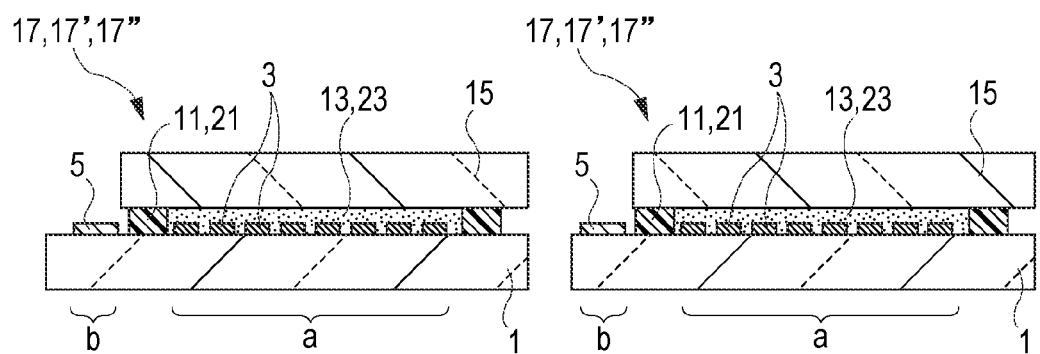

Next, as shown in FIG. 3D, the base substrate 1 and the sealing substrate 15 which are tightly adhered to each other with the fully cured first resin material 11 and the second resin material 13 are cut into sections each containing the display region a and the peripheral region b. In this step, grooves are formed in the base substrate 1 and the sealing substrate 15 using a glass scriber, and impact is applied by a glass breaker to the grooves thus formed so that cracks are grown from the grooves, thereby cutting unnecessary parts of the base substrate 1 and the sealing substrate 15 by cutting. As a result, display devices 17 each having the display region a and the peripheral region b are obtained.

The display devices 17 thus formed are each composed of the base substrate 1 provided with the organic electroluminescent devices 3 and the terminal electrodes 5 connected thereto and the sealing substrate 15 disposed to face this base substrate 1. The first resin material 11 is provided between the base substrate 1 and the sealing substrate 15 so as to surround the display region a in which the organic electroluminescent devices 3 are provided and so as to dispose the peripheral region b in which the terminal electrodes 5 are provided outside the first resin material 11. In addition, the second resin material 13 is filled in the region surrounded by the first resin material 11 so as to seal the organic electroluminescent devices 3.

According to the first embodiment, as described with reference to FIG. 1C, the second resin material 13 is applied in the display region a surrounded beforehand by the first resin material 11. By the structure described above, when the fluidity of the first resin material 11 is decreased, the second resin material 13 is prevented from flowing into the peripheral region b which is located outside the first resin material 11. Hence, the application of the resin material can be strictly controlled in the display region a surrounded by the first resin material 11, and as a result, the adhesion of the resin material to the terminal electrodes 5 disposed in the peripheral region b can be prevented.

Accordingly, since it is not necessary to cover the terminal electrodes 5 with a masking tape for preventing the adhesion of the resin material, as compared to the method in which the substrates are adhered to each other while the adhesion of the resin material to the terminal electrodes 5 is prevented by covering them with a masking tape, the distance between the base substrate 1 and the sealing substrate 15 can be decreased. As a result, the thickness of the display device 17 can be further decreased.

In addition, as described above with reference to FIG. 1A, since the organic electroluminescent devices 3 are formed on the base substrate 1 so that light is emitted from the side opposite to the base substrate 1, this light passes through the second resin material 13 and is then emitted from the sealing substrate 15 side. In this case, as described above, since the distance between the base substrate 1 and the sealing substrate 15 can be decreased, the length of a path through which the emission light passes is decreased. As a result, the generation of color shift which occurs at a wide viewing angle can be suppressed.

In particular, according to the procedure in which after the first resin material 11 is formed using a slow-curing resin, polymerization thereof is initiated by UV irradiation to the first resin material 11, followed by application of the second resin material 13, the first resin material 11 can be cured to a certain extent while the fluidity thereof is maintained. Hence, only in the display region a surrounded by the first resin material 11, the fluidity thereof being maintained low since the curing proceeds to a certain extent, the second resin material 13 can be reliably applied without flowing out of the display region. In addition, in the subsequent adhesion step, the first resin material 11 can maintain its adhesion properties.

Furthermore, a material that adheres between the base substrate 1 and the sealing substrate 15 is composed of the two types of resin materials, that is, the first resin material 11 and the second resin material 13. Hence, as for the first resin material 11 provided outside, a function may be primarily considered that prevents the entry of moisture from the outside through the interface between the base substrate 1 and the sealing substrate 15 and through the first resin material 11. On the other hand, as for the second resin material 13, a function may be primarily considered that maintains a transmission factor of 80% or more at a predetermined thickness without causing any damage to the organic electroluminescent devices 3. Hence, the selection ranges of the resin materials used for the first resin material 11 and the second resin material 13 can be increased. However, when an adhesive function to a certain extent is also conferred on the second resin material 13, the display device 17 can be formed so as to have improved moisture resistance and high reliability.

Furthermore, since the second resin material 13 is applied in the display region a surrounded by the first resin material 11, as the second resin material 13 covering the organic electroluminescent devices 3, a resin can be used having a low viscosity as compared to that of a resin used in the past, and from this point of view, the selection range of the resin material can also be increased. In addition, as for the first resin material 11, since the polymerization thereof is initiated by UV irradiation after the first resin material is formed by application, and the substrates 1 and 15 are then adhered to each other, when the first resin material 11 is formed by application, a material having a low viscosity as compared to that of a resin used in the past may also be used for forming the first resin material 11. As a result, when the first resin material 11 is formed around the display region a by application, generation of discontinuity of the first resin material 11 can be prevented, and hence a reliable sealing state of the organic electroluminescent devices 3 provided in the display region a can be obtained.

<Second Embodiment>

FIGS. 4A to 4D show a method for manufacturing a display device, according to the second embodiment. The difference of the method shown in the figures according to the second embodiment from the above method according to the first embodiment is that the second resin material for sealing the organic electroluminescent devices is formed from a slow-curing resin. The method of this embodiment is performed as described below.

Figure 4A:
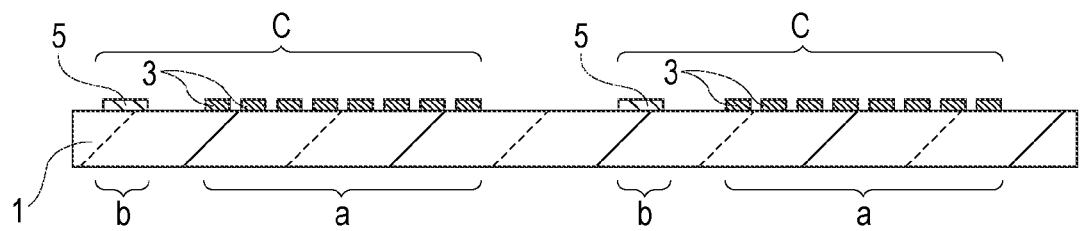
FIGS. 4A to 4D are each a cross-sectional view of a display device in process for illustrating a manufacturing method according to a second embodiment of the present invention.

First, in a step shown in FIG. 4A, as is the case of the first embodiment described with reference to FIG. 1A, the organic electroluminescent devices 3 are formed in an array in the display region a of the base substrate 1, and the terminal electrodes 5 are formed in the peripheral region b.

Figure 4B:
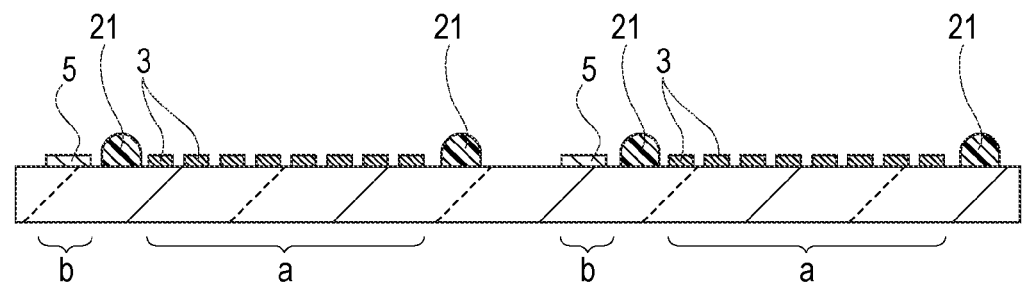

Subsequently, as shown in FIG. 4B, a first resin material 21 is formed on the base substrate 1 so as to surround one display region a in which the organic electroluminescent devices 3 are provided and so as to dispose the peripheral region b in which the terminal electrodes 5 are provided outside the first resin material 21. The width and the height of this first resin material 21, which are formed by application, may be similar to those in the first embodiment. However, the first resin material 21 is not necessarily formed of a slow-curing resin and may be formed of a UV curable resin or a thermosetting resin primarily composed of an epoxy resin or an acrylic resin. In addition, as additives for the first resin material 21, various additives such as an inorganic filler, spacers, adhesion improver, reinforcing agent, softener, plasticizer, and viscosity controller may also be used.

Figure 4C:
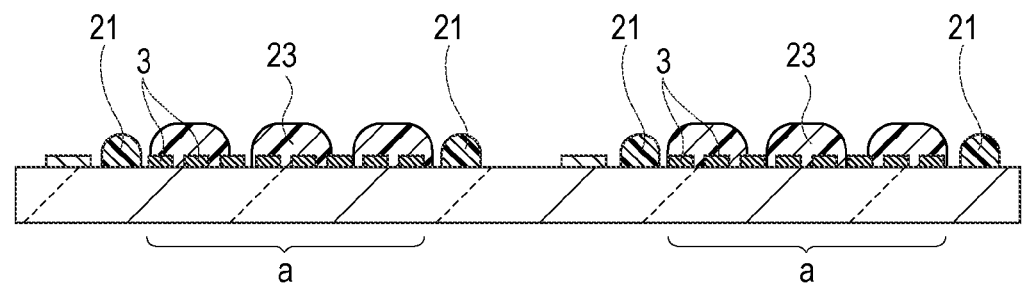

As shown in FIG. 4C, in the display region a surrounded by the first resin material 21, a second resin material 23 formed of a slow-curing resin is applied. The slow-curing resin is a resin that maintains the fluidity even after being irradiated with UV rays and is then fully cured after a predetermined time passes. As the slow-curing resin described above, a resin similar to that shown as the slow-curing resin forming the first resin material 11 of the first embodiment may be used.

Next, this second resin material 23 has an adhesive function as is the second resin material 13 of the first embodiment and is formed of a resin having a transmission factor of 80% or more after the resin is cured. In addition, a resin material having an adhesive function preferably has a tensile adhesive strength of 1 MPa or more or a tensile shear adhesive strength of 1 MPa or more after curing. In addition, the coating state may be similar to that in the first embodiment.

In addition, although not shown in the figure, the temporary adhesive resin is also applied to the end portion of the base substrate 1 as is the case of the first embodiment.

Furthermore, the formation of the first resin material 21, the second resin material 23, and the temporary adhesive resin are preferably performed in an inert gas atmosphere as is the case of the first embodiment, and when being performed within a short period of time after the organic layer is formed, the formation may be performed in the air.

Figure 4D:
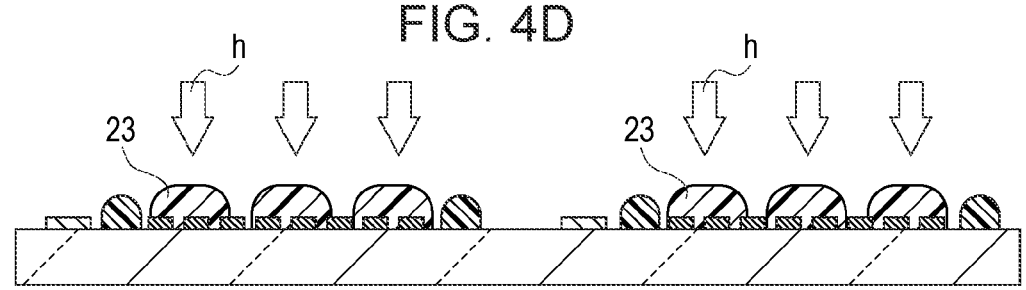

Subsequently, as shown in FIG. 4D, only the second resin material 23 is irradiated with the UV rays h. By this irradiation, polymerization of the second resin material 23 composed of a UV curable resin (slow-curing resin) having slow curing properties is initiated. In this step, the amount of the UV rays h may not be an amount required for fully curing a resin forming the second resin material 23, and the total amount of the UV rays h and UV rays to be irradiated after the sealing substrate is adhered to the base substrate may reach the above required amount.

In addition, it is also important to adjust the amount of the UV rays h so as not to fully cure the second resin material 23 before the subsequent adhesion step is performed, and right before the adhesion, as is the first resin material 11 in the first embodiment, the degree of curing is preferably 70% or less.

Subsequent steps following the above-described steps are performed in a manner similar to that described in the first embodiment with reference to FIGS. 3A to 3D, and as a result, display devices 17' shown in FIG. 3D are obtained. The display device 17' thus obtained has the base substrate 1 provided with the organic electroluminescent devices 3 and the terminal electrodes 5 connected thereto and the sealing substrate 15 disposed to face the base substrate 1. In addition, the first resin material 21 is provided between the base substrate 1 and the sealing substrate 15 so as to surround the display region a in which the organic electroluminescent devices 3 are provided and so as to dispose the peripheral region b in which the terminal electrodes 5 are provided outside the first resin material 21, and in the region surrounded thereby, the second resin material 23 is filled so as to seal the organic electroluminescent devices 3.

According to the above second embodiment, as described with reference to FIG. 4C, as is the case of the first embodiment, the second resin material 23 is applied in the display region a surrounded beforehand by the first resin material 21. Hence, as is the case of the first embodiment, it is not necessary to cover the terminal electrodes 5 with a masking tape in order to prevent the adhesion of the resin material; hence, the thickness of the display device 17' can be further decreased, and in addition, when light generated from the organic electroluminescent devices 3 is emitted from the sealing substrate 15 side, the generation of color shift can be suppressed which occurs at a wide viewing angle.

Furthermore, since a material that adheres between the base substrate 1 and the sealing substrate 15 is composed of two types of resin materials, that is, the first resin material 21 and the second resin material 23 as is the case of the first embodiment, the selection ranges of the resin materials can be increased, and when an adhesive function to a certain extent is also conferred on the second resin material 23, the display device 17' can be formed so as to have improved moisture resistance and higher reliability.

In addition, as is the case of the first embodiment, since the second resin material 23 is applied in the display region a surrounded by the first resin material 21, the second resin material 23 may be formed using a resin material having a lower viscosity, and as a result, the sealing state of the organic electroluminescent devices 3 provided in the display region a can be made reliable.

<Third Embodiment>

FIGS. 5A to 5D show a method for manufacturing a display device, according to the third embodiment. The difference of the method shown in the figures according to the third embodiment from the above methods according to the first and the second embodiments is that the first resin material and the second resin material are each formed of a slow-curing resin. The method of this embodiment is performed as described below.

Figure 5A:
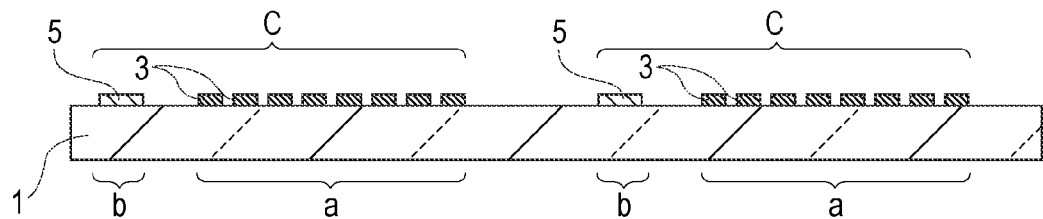
FIGS. 5A to 5D are each a cross-sectional view of a display device in process for illustrating a manufacturing method according to a third embodiment of the present invention.

First, in a step shown in FIG. 5A, as is the case of the first embodiment described with reference to FIG. 1A, the organic electroluminescent devices 3 are formed in an array in the display region a of the base substrate 1, and the terminal electrodes 5 are formed in the peripheral region b.

Figure 5B:
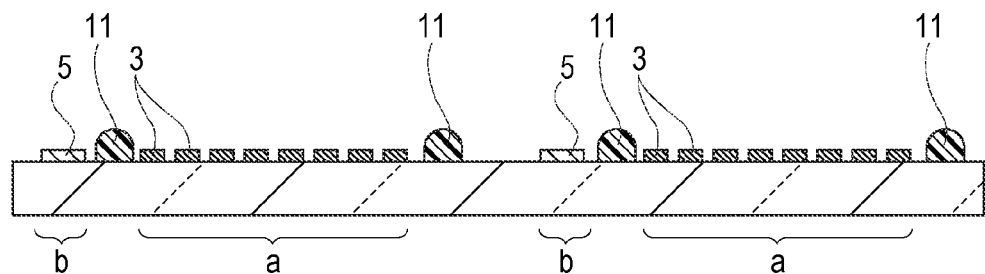

Next, as shown in FIG. 5B, the first resin material 11 composed of a slow-curing resin similar to that in the first embodiment is formed on the base substrate 1 so as to surround one display region a in which the organic electroluminescent devices 3 are provided and so as to dispose the peripheral region b in which the terminal electrodes 5 are provided outside the first resin material 11.

Figure 5C:
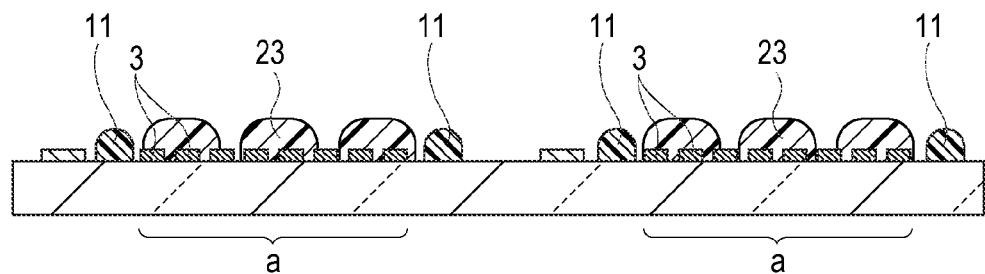

Next, as shown in FIG. 5C, as is the case of the second embodiment, the second resin material 23 composed of a slow-curing resin having a transmission factor of 80% or more after the resin is cured is applied in the display region a surrounded by the first resin material 11.

Subsequently, although not shown in the figures, as is the case of the first embodiment, the temporary adhesive resin is applied to the end portion of the base substrate 1.

Furthermore, the formation of the first resin material 11, the second resin material 23, and the temporary adhesive resin are preferably performed in an inert gas atmosphere as is the first embodiment; however, when performed within a short period of time after the organic layer is formed, the formation may be performed in the air.

Figure 5D:
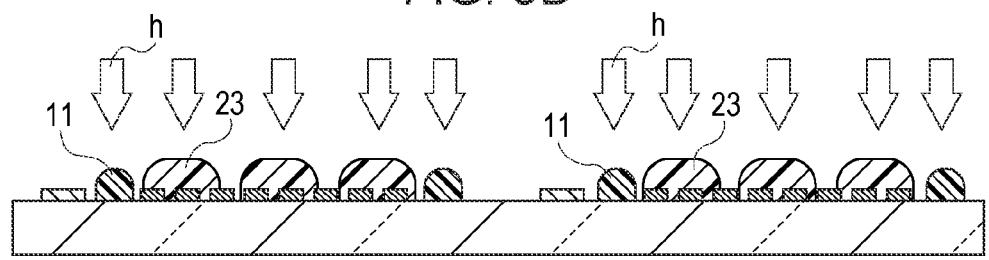

Subsequently, as shown in FIG. 5D, the first resin material 11 and the second resin material 23 are irradiated with the UV rays h. By this irradiation, polymerization of the first resin material 11 and that of the second resin material 23, which are formed of a UV curable resin (slow-curing resin) having slow curing properties, are initiated. In this step, the amount of the UV rays h may not be an amount required for fully curing the resins forming the first resin material 11 and the second resin material 23, and the total amount of the UV rays h and UV rays to be irradiated after the sealing substrate is adhered to the base substrate may reach the above required amount.

In addition, it is also important to adjust the amount of the UV rays h so as not to fully cure the first resin material 11 and the second resin material 23 before a subsequent adhesion step is performed, and right before the adhesion, the degree of curing of the first resin material 11 and that of the second resin material 23 are preferably 70% or less as is the case described in the first embodiment.

Subsequent steps following the above steps are performed in a manner similar to that described in the first embodiment with reference to FIGS. 3A to 3D, and as a result, display devices 17" shown in FIG. 3D are obtained. The display device 17" thus obtained has the base substrate 1 provided with the organic electroluminescent devices 3 and the terminal electrodes 5 connected thereto and the sealing substrate 15 disposed to face the base substrate 1. In addition, the first resin material 11 is provided between the base substrate 1 and the sealing substrate 15 so as to surround the display region a in which the organic electroluminescent devices 3 are provided and so as to dispose the peripheral region b in which the terminal electrodes 5 are provided outside the first resin material 21, and in the region surrounded by this first resin material 11, the second resin material 23 is filled so as to seal the organic electroluminescent devices 3.

According to the above third embodiment, as described with reference to FIG. 5C, as is the case of the first embodiment, the second resin material 23 is applied in the display region a surrounded beforehand by the first resin material 11. Hence, as is the case of the first embodiment, it is not necessary to cover the terminal electrodes 5 with a masking tape in order to prevent the adhesion of the resin material; hence, the thickness of the display device 17" can further be decreased, and in addition, when light generated from the organic electroluminescent devices 3 is emitted from the sealing substrate 15 side, the generation of color shift can be suppressed which occurs at a wide viewing angle.

Furthermore, since a material that adheres between the base substrate 1 and the sealing substrate 15 is composed of two types of resin materials, that is, the first resin material 11 and the second resin material 23 as is the case of the first embodiment, the selection ranges of the resin materials can be increased, and when an adhesive function to a certain extent is also conferred on the second resin material 23, the display device 17" can be formed so as to have improved moisture resistance and higher reliability.

In addition, as is the case of the first embodiment, since the second resin material 23 is applied in the display region a surrounded by the first resin material 11, the second resin material 23 may be formed using a resin material having a lower viscosity, and as a result, the sealing state of the organic electroluminescent devices 3 provided in the display region a can be made reliable.

In the above first to the third embodiments, the display device having the base substrate 1 and the organic electroluminescent devices 3 provided thereon is described by way of example. However, the present invention is not limited to application of display devices using organic electroluminescent devices but may widely be applied to display devices using self-luminous light-emitting devices such as inorganic light-emitting devices.

In addition, in the above first to the third embodiments, the case in which the first resin material 11 (21) and the second resin material 13 (23) are formed on the base substrate 1 is described. However, the first resin material 11 (21) and the second resin material 13 (23) may be formed at the sealing substrate 15 side. In this case, when the base substrate 1 and the sealing substrate 15 are adhered to each other with the first resin material 11 (21) and the second resin material 13 (23) provided therebetween so as to obtain a predetermined state in which the individual constitute elements are positioned at predetermined places, the first resin material 11 (21) is formed at the sealing substrate 15 side so as to surround the display region a formed at the base substrate 1 side. Subsequently, steps other than those described above are performed in a manner similar to that described in the first to the third embodiments. As a result, an effect similar to that of the first to the third embodiments can be obtained. Furthermore, in order to decrease the process time, when the first resin material 11 (21) is applied on the base substrate 1, the second resin material 13 (23) may be simultaneously applied at the sealing substrate 15 side, or when the second resin material 13 (23) is applied on the base substrate 1, the first resin material 11 (21) may be simultaneously applied at the sealing substrate 15 side.

In addition, in the above embodiments, the process is described in which after the first resin material 11 (21) is applied on the base substrate 1 or the sealing substrate 15, the second resin material 13 (23) is applied in the region surrounded by this first resin material 11 (21), and before the substrates 1 to 15 are adhered to each other, polymerization of at least one of the resin layers is initiated. However, the process described above may be optionally changed. For example, the second resin material may be applied before the first resin material is applied, and polymerization of at least one of the resin layers may be initiated during or after the above application.

In addition, a manufacturing device unit performing the sequential steps described in the first to the third embodiments has a dispensing device (dispenser) used for applying the first resin material 11 (21), the second resin material 13 (23), and the temporary adhesive resin, an adhesion device provided with a reduced-pressure chamber, a heating device, a UV irradiation device, and a reduced-pressure process chamber. In addition, when the dispensing device, the heating device, and the UV irradiation device work independently of the adhesion device provided with the reduced-pressure chamber, more precise adhesion can be performed at a low cost. However, the adhesion step described with reference to FIGS. 3A and 3B is not necessarily performed in a reduced-pressure atmosphere; however, when the step is performed in the air, areas (dark spots) at which light is not emitted are generated or the brightness is degraded due to moisture contained in the air, it is preferable that steps right before the adhesion step be performed at least in an inert gas atmosphere.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
a base substrate with light-emitting devices and terminal electrodes connected thereto; a sealing substrate disposed to face the base substrate;
a first resin material between the base substrate and the sealing substrate so as to at least partially surround a periphery of a first region in which the light-emitting devices are provided; and
a second resin material between the base substrate and the sealing substrate and filled in the first region surrounded by the first resin material so as to seal the light-emitting devices,
wherein,
at least one of the first resin material and the second resin material includes a slow-curing resin operable to maintain fluidity after radiation and be fully cured via passage of time.

2. The display device according to claim 1, wherein the first resin material and the second resin material are adhered directly to the base substrate and the sealing substrate.

3. The display device according to claim 1, wherein the first resin material and the second resin material each have a thickness of 25 µm or less.

4. The display device according to claim 1, wherein light generated from the light-emitting devices is emitted from the sealing substrate side.

5. The display device according to claim 1, wherein a first one of the terminal electrodes, the first resin material, and the second resin are sequentially positioned along the base substrate.

6. The display device according to claim 1, wherein the first resin material is spaced from the terminal electrodes along the base substrate.

7. The display device according to claim 1, wherein the first resin material adheres the base substrate to the sealing substrate and includes a filler to provide moisture impermeability.

8. The display device according to claim 1, wherein the light emitting diodes are sealed in the second resin material.

9. The display device according to claim 1, wherein the second resin material maintains a light transmission factor of 80% or more.

10. The display device according to claim 1, wherein the light emitting diodes are entirely surrounded by the substrate and the second resin material.

* * * * *